United States Patent [19]

Watanabe et al.

[11] Patent Number: 4,763,827

[45] Date of Patent: * Aug. 16, 1988

[54] MANUFACTURING METHOD

[75] Inventors: Kenji Watanabe, Kodaira; Isamu Yamazaki, Higashiyamato; Ryuichi Kyomasu, Kodaira; Nobuhiro Takasugi, Tokyo; Tsutomu Mimata, Akikawa; Osamu Kakutani, Ohme, all of Japan

[73] Assignees: Hitachi, Ltd.; Hitachi Tokyo Electronics, both of Tokyo, Japan

[ * ] Notice: The portion of the term of this patent subsequent to Jun. 23, 2004 has been disclaimed.

[21] Appl. No.: 38,939

[22] Filed: Apr. 16, 1987

Related U.S. Application Data

[62] Division of Ser. No. 772,823, Aug. 6, 1985, Pat. No. 4,674,670.

[51] Int. Cl.$^4$ ............................................. B23K 31/00
[52] U.S. Cl. .................................. 228/102; 228/105; 228/6.2; 228/47
[58] Field of Search .................. 228/102, 105, 47, 6.2, 228/9

[56] References Cited

U.S. PATENT DOCUMENTS 3,973,713 8/1976 Furuya et al. ...................... 228/102
4,301,958 11/1981 Hatakenaka et al. ................. 228/6.2
4,526,646 7/1985 Suzuki et al. ....................... 414/225
4,674,670 6/1987 Watanabe et al. ................... 228/102

Primary Examiner—Nicholas P. Godici
Assistant Examiner—Karen Skillman
Attorney, Agent, or Firm—Antonelli, Terry & Wands

[57] ABSTRACT

The invention relates to a manufacturing apparatus which comprises moving means which continuously moves the works that are transferred along a frame chute, and detector means which detects at least a portion of the work that is moved. The moving means is controlled by kind-of-work data and by a work position signal from the detector means, and the work is set to a predetermined position. Hence, even a work of a different kind can be set to an optimum bonding position without the need of exchanging the unit, making it possible to perform the operation fully automatically and to meet general purposes.

Further, provision is made of means which moves the frame chute in a direction at right angles with the direction in which the work is moved, so that even that work that has different widths and shapes in the widthwise direction can be placed in position and subjected to the bonding fully automatically.

The detector means can be provided not only at the bonding position but also at a position on the upstream side having a relation relative to the bonding position.

The invention can be adapted particularly effectively to a wire bonder and a pellet bonder.

21 Claims, 6 Drawing Sheets

MANUFACTURING METHOD

This is a continuation application of Ser. No. 772,823, filed Aug. 6, 1985 now U.S. Pat. No. 4,674,670.

BACKGROUND OF THE INVENTION

The present invention relates to a manufacturing apparatus, and particularly to a manufacturing apparatus that is suitably adapted to a general-purpose bonder as represented by a wire bonder which is designed for fabricating a variety of kinds of lead frames fully automatically and highly efficiently.

Accompanying the trend toward producing diversifying kinds of semiconductor devices such as IC's and LSI's in recent years, it is a tendency to utilize a general-purpose semiconductor manufacturing apparatus which is capable of manufacturing a variety of devices instead of using a special apparatus which manufactures only a single kind of device. For instance, the same tendency holds true even for a pellet bonder for adhering pellets onto lead frames, and for a wire bonder for connecting very fine wires between the pellet and the lead frame; i.e., efforts have been made to improve these apparatuses so that they meet general purposes.

Referring, for example, to the wire bonder, the lead frames (hereinafter referred to as works or workpiece) onto which element pellets are fastened are placed on a bonding stage, the works that are continuously formed are incrementally moved by a feeding mechanism called a frame feeder, and bonding positions on the works are successively set to a position corresponded to a bonding tool, thereby to bond the wires. Here, in order to incrementally feed the works, feed pins on the side of the frame feeder are fitted into positioning holes formed in the works, so that the works are moved as a whole by the feed pins. In this case, the frame feeder is constituted depending upon the kind of works, i.e., depending upon the shape, dimension, and the like of works and, particularly, the feed pins are so constituted as will be adapted to the positioning holes of works.

Therefore, even though it has been demanded to construct apparatuses to meet general purposes as described above, there exists difference in the shapes of works, dimensions, positions of holes, and sizes of holes depending upon the kinds of devices (standards of the lead frames are different among the manufacturers), making it difficult to accomplish correct positioning by the frame feeder for the works of different kinds. With the existing apparatuses of this type, therefore, the bonding stage or the frame feeder are constructed in the form of a unit so as to be exchanged depending upon the kind of devices, to meet general purposes.

With such apparatuses, however, the unit must be exchanged for each change in the kind of devices, involving laborious work for replacement, very cumbersome adjusting operation consuming extended periods of time, and making the operation efficiency and the manufacturing efficiency poor. Moreover, the operator must carry out the manipulation after every change in the kind of devices, making it impossible to operate the apparatus fully automatically.

The technique of wire bonding has been closely disclosed in "Denshi Zairyo", November, 1982, Separate Volume, published by Kogyo Chosakai on Nov. 15, 1982, pp. 163-168.

SUMMARY OF THE INVENTION

The object of the present invention is to provide a fully automated general-purpose bonder which dispenses with the exchange of such a portion as the frame feeder unit for the works of different kinds, which enables the operation efficiency to be enhanced, and which follows automatically the change in the kind of devices to effect the bonding maintaining precision.

The above and other objects as well as novel features of the invention will become obvious from the description of the specification and the accompanying drawings.

A representative example of the invention disclosed in the application will be briefly described below.

Namely, provision is made for moving means to continuously move the works that are conveyed along the frame chute and detector means to detect at least a portion of the works that are moved, whereby the moving means is controlled relying upon the data related to the kind of works and work position signals produced by the detector means, in order to set the works at predetermined positions. That is, the works are set at optimum bonding positions without the need of exchanging the unit even for work of different kinds, and the manufacturing operation is carried out fully automatically satisfying general purposes.

According to the present invention, furthermore, provision is made for means to move the frame chute in a direction at right angles to the direction in which the work is moved, in order to effect the positioning and bonding fully automatically even for the works having different widths and shapes in the direction of width thereof.

Moreover, the detector means can be provided not only at the bonding position but at a position on the upstream side which establishes a relation relative to the bonding position.

The invention can be adapted particularly effectively to wire bonders and pellet bonders.

DESCRIPTION OF THE PREFERRED EMBODIMENTS

[Embodiment 1]

Figure 1:
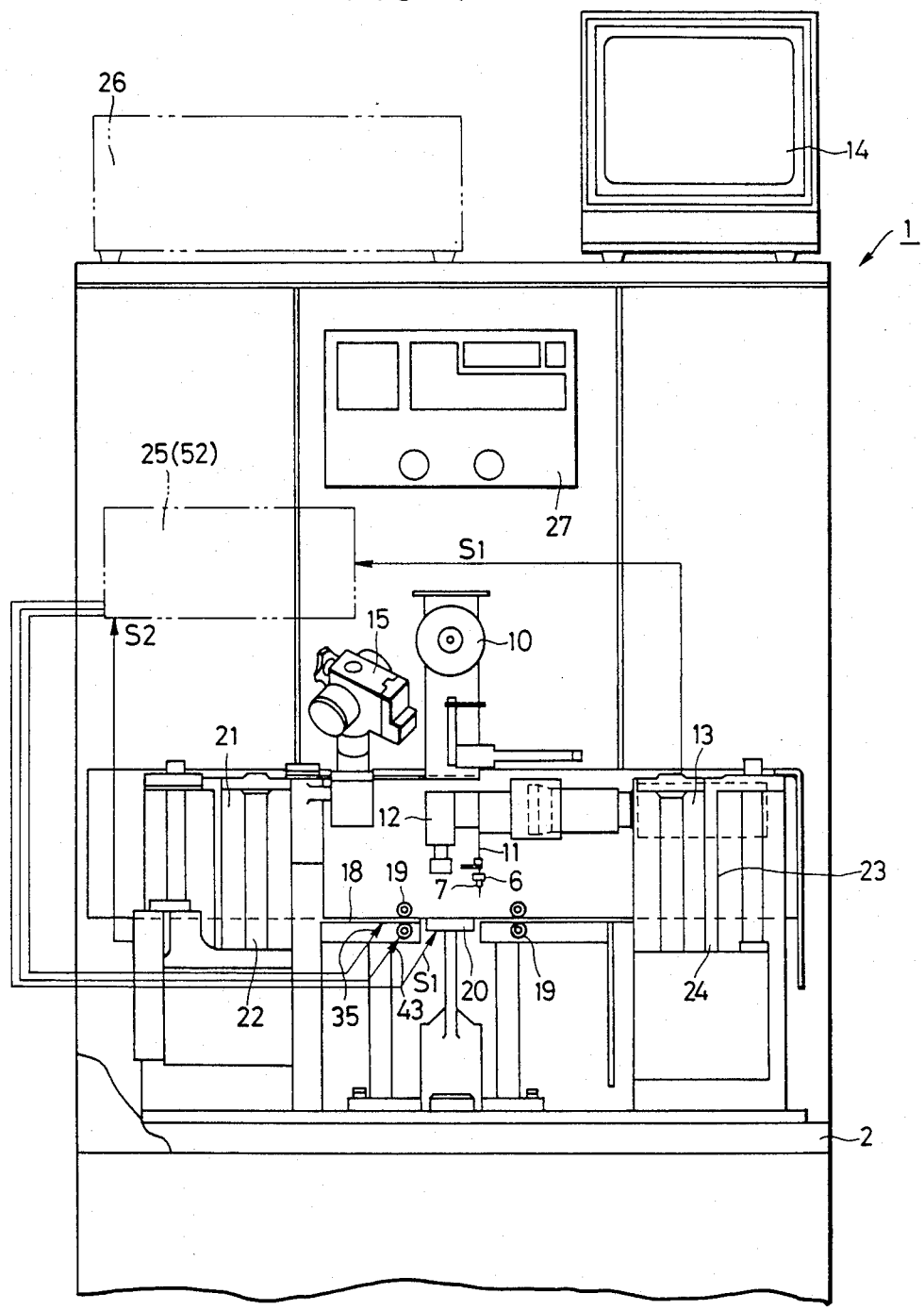
FIG. 1 is a front view of a first embodiment of the present invention.

FIGS. 1 to 5 illustrate an embodiment of the present invention, and particularly illustrate the whole structure when the present invention is adapted to a wire bonder of the single independent type.

As shown in the drawings, a wire bonder 1 has an XY table 4 that is arranged on the upper rear portion of a frame 2 and that is driven by a motor 3 or the like. A bonding head 5 of a light weight is mounted on the XY table 4. Though not diagramed, the bonding head 5 is equipped with a cam mechanism to swing a bonding arm 6 which protrudes in front of the bonding head 5 up and down, so that a bonding tool (capillary) 7 attached to the end of the arm 6 is moved up and down. Further, a clamper 8 and a wire guide 9 protruded from the bonding head 5 at positions over the bonding arm 6. At an upper position, furthermore, there is provided a spool 10 on which is wound a very fine wire 11 for effecting the wire bonding onto the works (semiconductor members) that will be mentioned later. The wire 11 passes through between the wire guide 9 and the clamper 8, and the end thereof is inserted in the bonding tool 7. The clamper 8 is also actuated by the cam mechanism. Above the bonding head 5, there is arranged a TV camera 13 equipped with an optical system 12 which is an imaging device for work position detector means which detects pellet position on a lead frame and a lead position of the lead frame to effect the wire bonding automatically. The TV camera takes an image on an enlarged scale of a work moved onto a bonding stage 17 that will be described later, detects a pellet position or a lead position or both by a recognizing device that is not shown, so that the bonding position can be controlled. In addition to the TV camera 13, a microscope 15 is also arranged so that the operator is allowed to observe the work on an enlarged scale.

Figure 2:
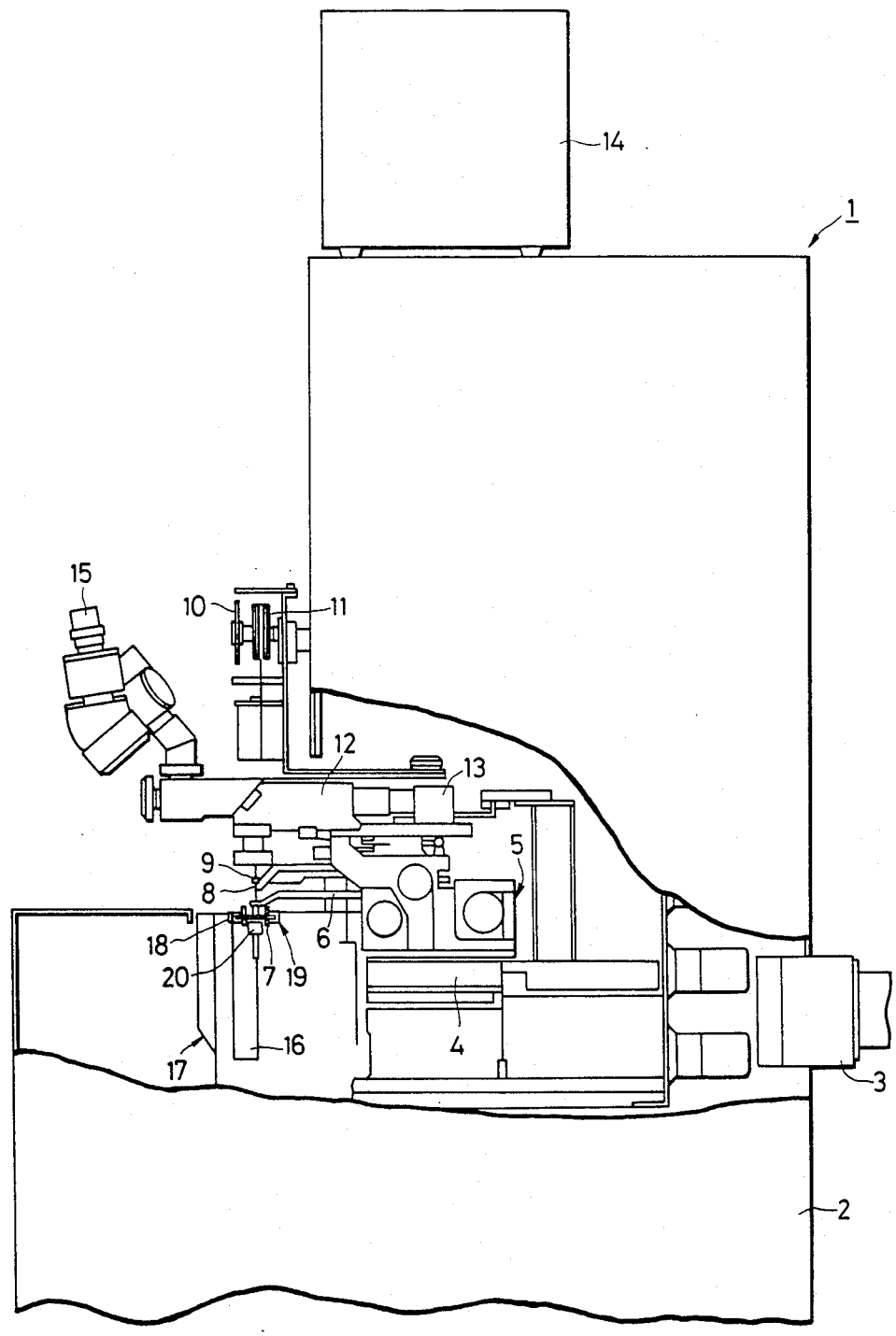
FIG. 2 is a side view.
Figure 3:
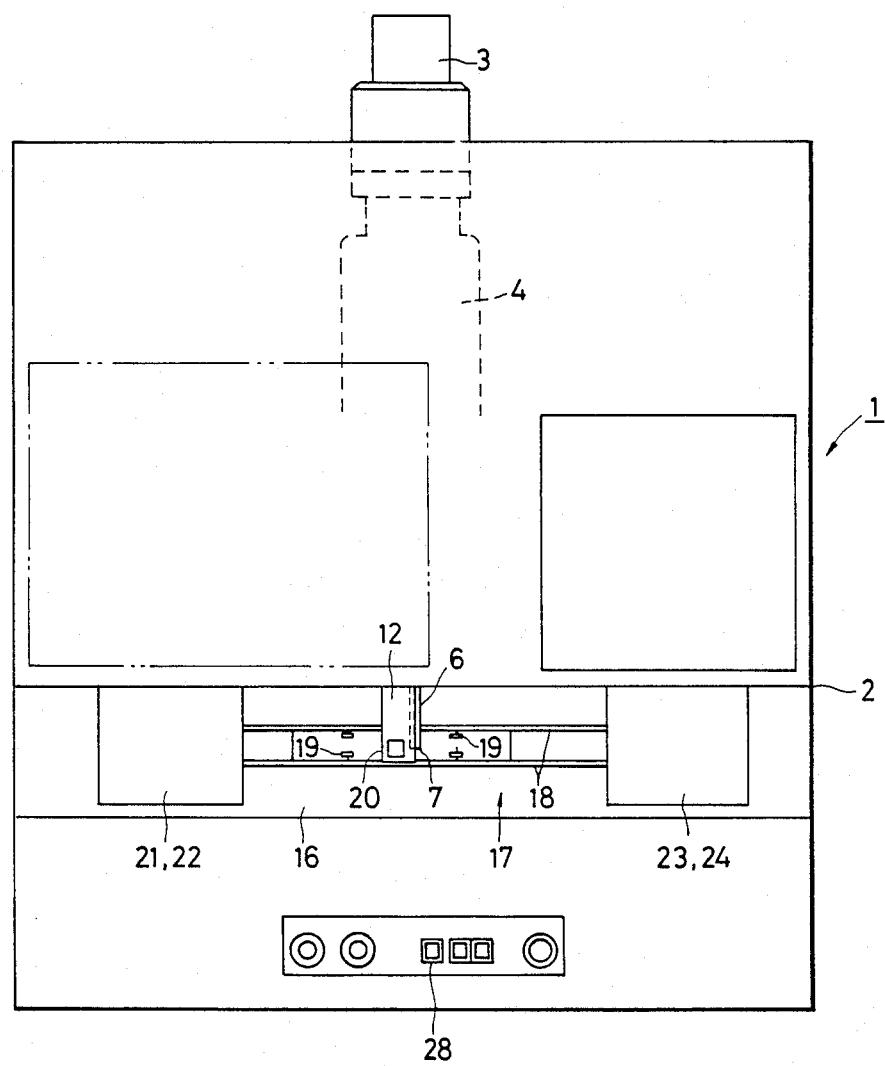
FIG. 3 is a plan view.

In front of the bonding head 5, furthermore, there is provided a stage frame 16 on the frame 2 to constitute the bonding stage 17. On the stage frame 16, there is provided a frame chute 18 consisting of a pair of chutes that are arranged in parallel in the back and forth direction and that stretch in the right and left direction. Adjacent to the frame chute 18, furthermore, there is provided a frame feeder 19 which serves as work moving means, which moves the works sent onto the frame chute 18 by the action of the frame feeder 19 from the left toward the right in FIG. 1, and which stops them just under the bonding tool 7, so that the wire bonding is effected for the works. A heat block 20 is arranged under the frame chute 18 to heat the work that is moved on the frame chute 18 and stopped. A case 21 holding the works are set to the left side of the bonding stage 17, a loader 22 is provided to take out the works one by one and to send them to the frame chute 18, an empty case 23 is set to the right side, and an unloader 24 is provided to put into the case the works which are conveyed to the right end of the frame chute 18 and to which the wire has been bonded. In FIGS. 1 to 3, reference numeral 25 denotes various units holding electric circuit parts, 26 denotes an ultrasonic wave oscillator provided as required, 27 denotes an operation panel, and 28 denotes a manipulator.

Figure 4:
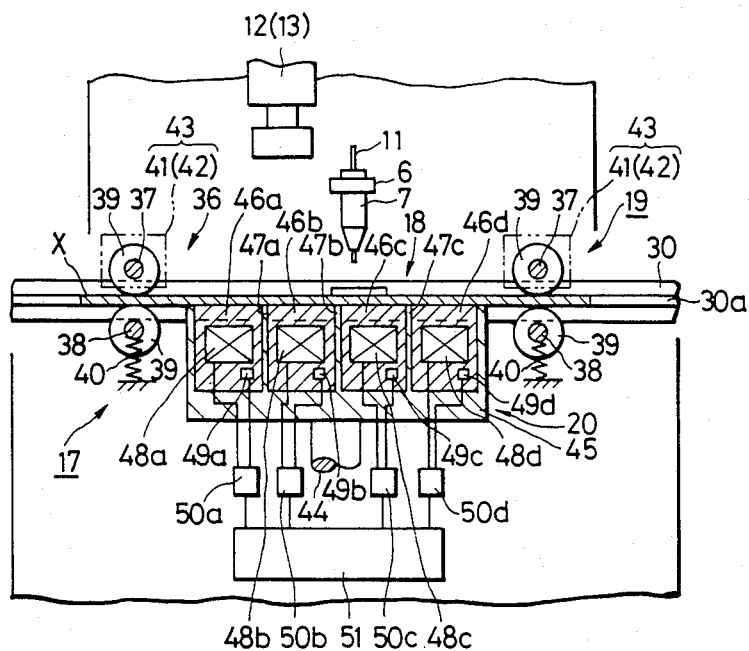
FIG. 4 is a front view showing major portions of a bonding stage.
Figure 5:
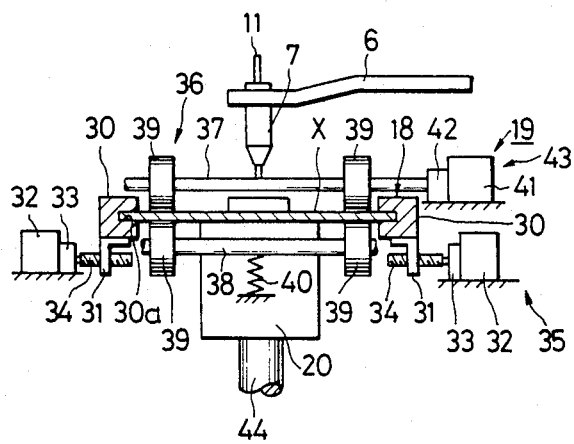
FIG. 5 is a side view thereof.

Construction of the bonding stage 17 is shown in FIGS. 4 and 5. A pair of chutes 30, 30 constituting the frame chute 18 that serves as chute moving means are made of rail members each having a U-shaped cross section. The chutes have grooves 30a, 30a that are opposed to each other, and are arranged maintaining a suitable distance, so that both sides of a work represented by a lead frame X are just fitted into the grooves 30a, 30a. In this embodiment, the chutes 30, 30 are provided with brackets 31, 31 as a unitary structure. Screws 34, 34 rotated by motors 32, 32 or gear mechanisms 33, 33 are screwed into the brackets 31, 31 in the direction of width of the chutes 30, 30 (in a direction at right angles with the direction of length). The motor 32, 32, gear mechanisms 33, 33, and screws 34, 34 constitute a chute adjusting portion 35. By driving the motors 32, 32, the screws 34, 34 are rotated via gear mechanisms 33, 33, and the chutes 30, 30 are independently moved in small amounts in the direction of width, to that positions in the direction of width are finely adjusted.

The frame feeder 19 has pinch rollers 36, 36 that are arranged at several places (two places in this embodiment) in the lengthwise direction of the frame chute 18. Each of the pinch rollers 36, 36 consists of rollers 39, 39 made of, for example, a resin attached to the upper and lower drive shafts 37, 37 and freely rotating shafts 38, 38 that stretch in the direction of width of chute 18. A work X is resiliently held from the upper and lower directions by the rollers 39, 39 by the force of springs 40, 40 urged to the freely rotating shafts 38, 38. The drive shafts 37, 37 are equipped with motors 41, 41, rotational angle detector mechanism that are not shown, and gear mechanisms 42, 42, thereby to constitute a roller drive portion 43. By driving the motors 41, 41, the drive shafts 37, 37 and rollers 39, 39 are rotated in the forward direction or in the reverse direction via gear mechanisms 42, 42, and the work X is moved along the frame chute 18. Here, the motors 41, 41 are rotated by a desired angle, whereby the rollers 39, 39 are turned, and the pinch rollers 19, 19 feed the work X by a predetermined amount.

The heat block 20 consists of a plurality of (four in this embodiment) blocks 46a to 46d that are divided in the lengthwise direction via heat-insulating walls 47a to 47c, and that are placed on a support block 45 supported at the upper end of an up-down moving shaft 44 as shown in FIG. 4. The blocks 46a to 46d contain heaters 48a to 48d and temperature sensors 49a to 49d, the pairs of heaters 48a to 48d and temperature sensors 49a to 49d being connected to temperature control portions 50a to 50d and being further connected to a temperature distribution control portion 51. Here, relying upon the heaters 48a to 48d and the temperature sensors 49a to 49d, temperatures of the blocks 46a to 46d are feedback-controlled by the temperature control portions 50a to 50d. The temperature distribution control portion 51 controls the temperature control portions 50a to 50d to maintain preset temperatures. The heat block 20 is brought into contact with the lower surface of work X on the frame chute 18 to heat the work X at a temperature suited for effecting wire bonding.

In addition to being constructed as mentioned above, the chute adjusting portion 35, the roller drive portion 43, and the temperature distribution control portion 51 are connected to a central control portion 52 as shown in FIG. 1, so that each of the portions is controlled by the central control portion 52. Cam mechanisms of the bonding head 5 and drive system of the XY table 4 may be related to the central control portion 52, as a matter of course. The central control portion 52 introduces signals $S_1$ from the TV camera 13 and kind-of-work signals $S_2$ from the loader 22, and an operation circuit contained therein calculates an optimum bonding portion of the work and the temperature (inclusive of temperature distribution) thereof. The central control portion 52 is, usually, comprised of a microcomputer, and stores a variety of data.

Function of the thus constructed wire bonder will be described below.

A work or workpiece (a lead frame to which an element pellet is attached in this emboidment) which is taken out from the case 21 and is set to the loader 22, is moved by a loader mechanism (not shown) onto the frame chute 18 with its both sides being guided by the grooves 30a, 30a of the chutes 30, 30. In this case, data related to the kind of work X and other data are sent as signals $S_2$ to the central control portion 52. The adjusting signal of the control portion 52 is sent to the chute adjusting portion 35 so that one or both of the chutes 30, 30 are moved by small amounts in the direction of width, and that the chutes 30, 30 will finally hold both sides of the work X maintaining a gap which permits the work X to move. This enables the position of the work X to be determined in the direction of width.

The work X moved onto the frame chute 18 is held at its upper and lower surfaces by the pinch roller 19 which is rotated by the roller drive portion 43, and is moved on the frame chute 18 in the lengthwise direction. At a moment when the work X constituted in the form of a series of lead frames is moved near to the first bonding position, the TV camera 13 detects the work X, and the central control portion 52 causes the pinch roller 19 to stop the moving operation. Namely, an image of the surface of work X is obtained, and the pattern (pad position) of the element pellet, shape of the lead, and external shape of the work, are sent as signals $S_1$ to the central control portion 52 which finds an optimum position of the work X, present position, and displacement thereof relying upon the above-mentioned signals $S_2$ and the signals $S_1$, and which produces an adjusting signal based thereupon to the roller drive portion 43, so that the pinch rollers are turned by a required angle. The pinch roller 19 is turned in the forward or reverse direction to move the work X in small amounts, thereby to determine the position of the work X in the lengthwise direction. To increase the positioning precision while the work is being moved, the heating block and the pressing plate are retracted to positions where they will not come into contact with the work. Further, the data related to temperature is sent from the central control portion 52 to the temperature distribution control portion 51 simultaneously therewith or in advance. Based upon the material, shape, size and the like of the work, the temperature distribution control portion 51 calculates the temperature distribution (gradient) of the whole heat block 20 so that an optimum heating can be effected, and sends setpoint temperature signals to the temperature control portions 50a to 50d. Therefore, the individual temperature control portions 50a to 50d set the temperatures for the blocks 46a to 46d relying upon feedback control, in order to suitably heat the work X. The bonding tool 7 effects the wire bonding in a customary manner, and its operation is not described here.

When the first bonding is finished, the central control portion 52 sends a signal to the roller drive portion 43 based upon the data related to pitch of the work X, and the pinch roller 19 moves the work X by an amount equal to the pitch. Here, the pinch roller 19 is turned by small amounts to precisely set the position of work in the same manner as described above. The frame chute 18 needs no adjustment, but may be adjusted as required. Further, the temperature distribution of the heat block 20 may often be suitably adjusted accompanying the movement of the work X.

After the bonding is finished, the work X is moved rightwardly by the pinch roller 19 and is introduced into the case 23 from the frame chute 18 by an unloader mechanism (not shown) of the unloader 24 at the extreme end of the frame chute 18. Thus, a series of steps are completed. A next work X will have been supplied onto the frame chute 18. When the work X is of the same kind as the previous one, the wire bonding is effected nearly under the same conditions. When the work X is of a different kind, the aforementioned operation is performed again, in order to accomplish the optimum wire bonding.

Here, instead of finely adjusting the position of work X, the pinch roller 19 may roughly set the position of the work X in accordance with the pitch of the work X. Then, deviation from a reference position of work X is detected by the TV camera 13, and then the bonding tool (bonding head 5 and XY table 4) is controlled to effect wire bonding. In this case, however, it becomes difficult to control the temperature very precisely with the heat block 20.

According to this embodiment, therefore, there is no need of exchanging the frame feeder unit even when work of different kinds is to be subjected to wire bonding. Therefore, wires can be bonded to various kinds of work automatically maintaining high precision and high quality without interrupting wire bonding. In other words, there is provided a general-purpose wire bonder.

[Embodiment 2]

Figure 6:
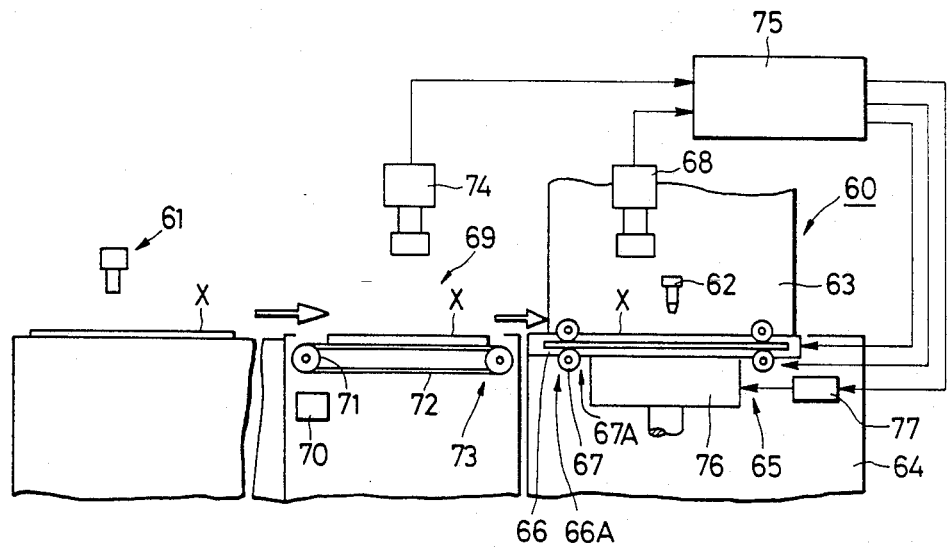
FIG. 6 is a schematic front view of a second embodiment.

FIG. 6 is a diagram showing the whole structure of an embodiment in which the present invention is adapted to a wire bonder 60 of the continuous processing type.

In FIG. 6, the wire bonder 60 is arranged at a position on the downstream side of a pellet bonder 61 (baking furnace and buffer are arranged between the wire bonder 60 and the pellet bonder 61). An element pellet is attached onto the work X, i.e., onto the lead frame, by the pellet bonder 61. The work X is then moved into the wire bonder 60 where wire bonding is effected.

Like the above-mentioned embodiment, the wire bonder 60 has a bonding head 63 with a bonding tool 62, and has a bonding stage 64 which is provided with a frame chute 66 that works as a frame feeder 65, and a pinch roller 67. Further, the bonding head 63 is equipped with a TV camera 68 for imaging the work X.

The wire bonder 60, however, is not provided with a loader or an unloader but, instead, is provided with a pre-stage 69 at a position just on the upstream side thereof. The pre-stage 69 is provided with a conveyer 73 which consists, for example, of motor 70, pulleys 71, belt 72, and the like. The work X sent from the pellet bonder 61 is moved from the left toward the right in the drawing, and is finally moved into the frame chute 66 via a conveyer that is not shown. A TV camera 74 is disposed over the pre-stage 69 to take the image of work X on the conveyer 73. The TV camera 74 is connected to the central control portion (same as the aforementioned portion 25) 75 together with the TV camera 68 of the wire bonder 60 to send image data signals of the work thereto. The central control portion 75 controls the chute adjusting portion 66A, roller drive portion 67A, and temperature distribution control portion 77 for the heat block 76 in the bonding stage 64.

As the work X to which the pellet has been bonded is moved onto the pre-stage 69, the conveyer 73 operates to move the work X. The conveyer 73 is stopped temporarily when the work X is brought to nearly a central position, and the work X is imaged by the TV camera 74. The imaged data are sent to the central control portion 75 where the kind, shape, and size of the work X are verified and stored, and where an optimum wire bonding position of the work X is calculated with the pre-stage 69 as a reference, and is converted into data for the bonding stage 64.

Then, the conveyer 73 operates again to move the work X to the right end where it is moved onto the frame chute 66 on the bonding stage 64 by a conveyer that is not shown. Since the chute adjusting portion 66A, roller drive portion 67A and temperature distribution control portion 77 have already been controlled by the data from the pre-stage 69, the bonding stage 64 is allowed to quickly place the work X under optimum bonding conditions in combination with imaged data from the TV camera 68. Functions of the frame chute 66, pinch roller 67 and heat block 76 based upon the chute adjusting portion 66A, roller drive portion 67A and temperature distribution control portion 77, are roughly the same as those of the aforementioned embodiment. This makes it possible to effect optimum wire bonding quickly and automatically for the works of a variety of kinds.

Figure 7:
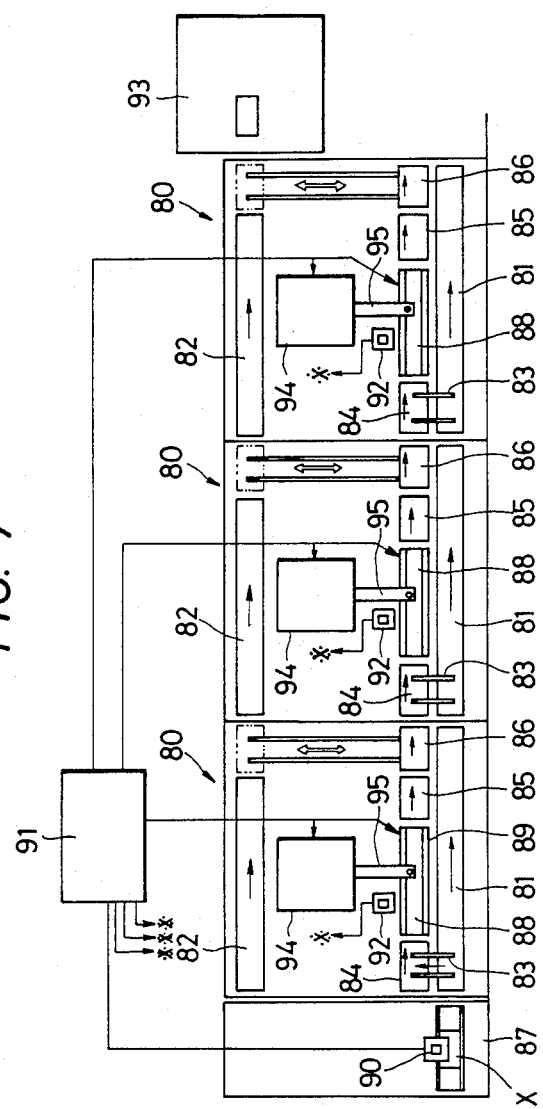
FIG. 7 is a schematic plan view of a modified embodiment.

In order to increase the efficiency of wire bonding, a plurality of (three in this case) wire bonders 80 may be arranged in parallel as shown in FIG. 7. Each of the wire bonders 80 have a frame-supply conveyer 81, a frame-discharge conveyer 82, a loader-side frame-moving conveyer 83, a loading conveyer 84, an unloading conveyer 85, and an unloader-side frame-moving conveyer 86, that move in the directions indicated by arrows. In particular, the unloader-side frame-moving conveyer 86 is capable of reciprocally moving in the directions indicated by a double-line arrow.

Therefore, the works X conveyed onto a pre-stage 87 at the furthest upstream position of the wire bonders 80 are successively moved rightwards by the frame-supply conveyer 81, scooped successively by the loader-side frame-moving conveyer 83 of each of the wire bonders 80, and are moved onto the frame chute 89 of the bonding stage 88. The wirebonded work X is moved from the unloading conveyer 85 onto the unloader-side frame-moving conveyer 86, and is further moved into a container portion 93 on the right side by the frame-discharge conveyer 82. In the drawing, reference numeral 94 denotes a bonding head, and 95 denotes a bonding tool.

The wire bonders 80 operate in parallel. Therefore, there is no waiting time for the work X, and bonding is carried out efficiently. Each wire bonder 80 is served with the data of work and control signals therefor sent from the TV camera 90 of the pre-stage 87 and from the central control portion 91. Based upon these data and signals, each bonding stage 88 controls the frame chute, pinch roller and heat block, which are not shown, and sets optimum bonding conditions in cooperation with its own TV camera 92.

Here, the loader-side frame-moving conveyer 83, loading conveyer 84, and unloading conveyer 85 can be removed and, instead, the loader case and unloader case can be mounted in each of the wire bonder 80, in order to use it as a single independent machine like in the aforementioned first embodiment.

[Embodiment 3]

Figure 8:
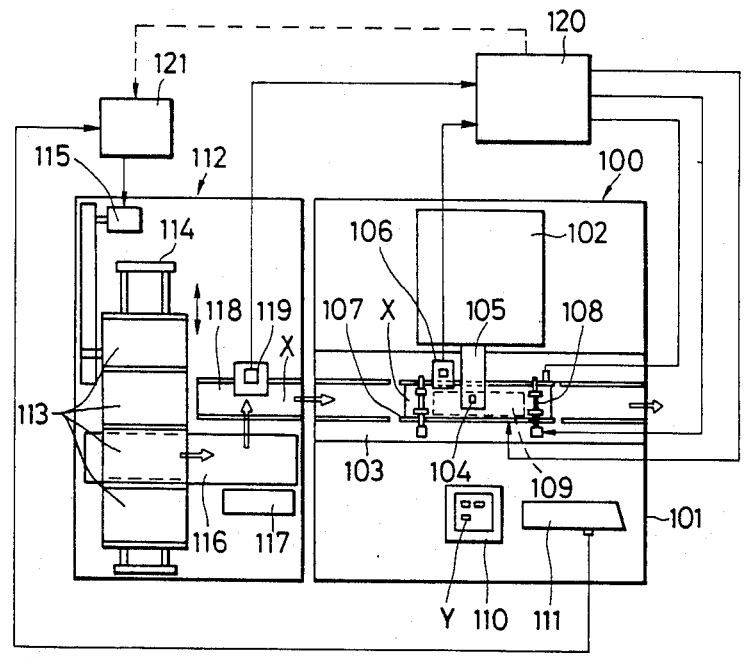
FIG. 8 is a schematic plan view of a third embodiment.

FIG. 8 is a plan view showing the structure of an embodiment in which the present invention is adapted to a pellet bonder. A pellet bonder 100 has a bonding head 102 and a bonding stage 103 mounted on a frame 101. The bonding head 102 has a collet 104 attached to the tip of a bonding arm 105, the collet 104 serving as a bonding tool which holds an element pellet Y and adheres it onto the work X such as lead frame. On the bonding head 102 is mounted a TV camera 106 directed to the stage 103.

On the bonding stage 103 are arranged a frame chute 107, a pinch roller 108, and a heat block 109 nearly in the same manner as the first embodiment. The work X guided by the frame chute 107 is moved by the pinch roller 108 rightwardly in the drawing, stopped at the bonding position, and is heated by the heat block 109. An intermediate pellet receiving portion 110 is disposed on a portion of the stage 103, and the element pellet Y to be bonded is conveyed by a supply system 111 from a wafer position which is not shown to the intermediate pellet receiving portion 110. The collet 104 adsorbs the pellet Y on the intermediate receiving portion 110, carries it onto the work at the bonding position, and adheres it thereto.

A work supply portion 112 is disposed on the upstream side of the pellet bonder 100. The work supply portion 112 has a case feeder 114 which holds in parallel a plurality of cases 113 that contain works of dissimilar kinds. The case feeder 114 is moved in a direction in which the cases are arranged in parallel by drive means 115 such as belt mechanism or the like. A loader 116 is provided under the feeder 114 to rightwardly move in the drawing a case 113 on the feeder 114 that stopped on the loader 116. A take-out mechanism 117 such as lifter or pusher is provided on the right side of the loader 116 to take out the work X from the case 113 onto a neighboring pre-chute 118 which is interlocked with the frame chute 107 of the pellet bonder 100 and which has a TV camera 119 installed thereon. The TV camera 119 is connected to the central control portion 120 together with the TV camera 106, and is further connected to each of the portions of the bonding stage 103. Further, the drive means 112 of the case feeder 114 is driven by a feeder control portion 121 which receives a kind-of-pellet signal from the pellet supply portion 111.

According to the above-mentioned construction, the kind-of-pellet signal is input to the feeder control portion 121 just when the pellet is supplied from the pellet supply portion 111 to the intermediate receiving portion 110. Then, the feeder control portion 121 selects a work that is adapted to the pellet, and the drive means 115 operates the case feeder 114, so that a required case 113 is moved onto the loader 116. Then, the loader 116 takes the case 113 out of the feeder 114, and the work X in the case 113 is moved onto the pre-chute 118 by the take-out mechanism 117.

In the pre-chute 118, the TV camera 119 obtains the image of work X, sends signals to the central control portion 120, so that the kind of work and adaptability are confirmed relying upon the sharp, size and the like of the work X. Here, relative positions of tabs of the work X can be introduced as data. The work X is moved onto the frame chute 107 of the pellet bonder 100, and is then moved and is placed in position by the pinch roller 108. At this moment, signals are sent from the central control portion 120 to the chute adjusting portion, roller drive portion and temperature distribution control portion (which are not shown), so that the chute 107, pinch roller 108 and heat block 109 are controlled to place the work X under optimum bonding conditions.

Here, if a constant or a predetermined relation is maintained with regard to relative positions between the pre-chute 118 and the frame chute 107, either one of the TV camera 106 or 119 can be eliminated. Further, either one of them can be replaced by another detector such as position sensor or the like.

According to this embodiment, there is no need for exchanging the case containing work or exchanging the frame feeder unit of the bonding stage for each change in the kind of work, in performing the process for bonding pellets onto semiconductor devices of dissimilar kinds. Therefore, pellets of various kinds can be bonded automatically and continuously maintaining high precision.

The present invention exhibits effects that are described below.

(1) Provision is made for moving means which continuously move the work, detector means which detecting portions of the work, and control means which find the present position of the work depending upon the data related to the kind of work and signals of the detector means, and which control the moving means based upon the present position of the work in order to set a portion of the work to be bonded to the bonding position. Therefore, even when work of different kinds is to be treated, there is no need to exchange the unit such as frame feeder. Works of various kinds can be set at an optimum bonding position, making it possible to carry out the operation fully automatically and to meet general purposes.

(2) Since use is made of the pinch roller as a moving means that holds the work and that is turned in a forward or reverse, direction the position can be set while moving the work in small amounts in the forward and reverse directions; i.e., the position of the work can be set highly precisely.

(3) A detector for detecting the bonding position can also be utilized as detector means.

(4) A TV camera is used as detector means which is provided on a pre-stage on the upstream side. Therefore, the kind of work, shape and size can be detected in advance, and the bonding position can be set quickly.

(5) Provision is made of second moving means for moving the frame chute in the direction of width responsive to the width of the work, in addition to moving means which moves the work in the lengthwise direction. Therefore, the position can be set not only in the lengthwise direction of the work but also in the direction of width. In particular, positions of work having different widths can be set maintaining high precision.

(6) The heat block provided on the bonding stage is divided in the direction of length, and temperatures of the individual blocks are independently controlled. Therefore, any desired temperature distribution can be selected to heat the work.

(7) Provision is made for detector means to detect the work on the upstream side of the bonder, moving means installed on the bonding stage to continuously move the work, and control means which controls the moving means based upon a work detect signal from the detector means and which sets the work to the bonding position. Therefore, even when work of different kinds is to be treated, there is no need to change the unit such as frame feeder. Work of various kinds can be set at an optimum bonding position, making it possible to carry out the operation fully automatically and to meet general purposes.

(8) A pre-stage is provided on the upstream side of the bonder, a TV camera is provided as detector means on the pre-stage to detect the shape, size, bonding position and the like of the work, and the position of the work is set by control means based upon a relation of relative positions between the pre-stage and the bonding position. Therefore, the operation can be effected quickly.

(9) A work supply portion is provided at a position on the upstream side of the bonder to supply work of various kinds, and necessary work is automatically supplied to the bonder. Therefore, the operation can be carried out fully automatically.

(10) In the work supply portion, cases containing work of various kinds are arranged on the feeder, and the positions of the cases are changed in the direction in which they are arranged. Therefore, the construction can be quite simplified and the work can be taken out correctly.

(11) When the apparatus is constructed to work as a pellet bonder, the work corresponding to an element chip can be automatically supplied by the work supply portion, and the element chip can be correctly adhered to a predetermined portion of the work, making it possible to automatically assemble the semiconductor devices.

In the foregoing the invention as described by way of specific embodiments. The invention, however, should in no way be limited to the above embodiments only, but can be modified variously without departing from the spirit and scope of the invention.

For instance, drive mechanisms such as the pinch roller that constitutes moving means and chutes that constitute second moving means, can be suitably changed. Instead of TV cameras, furthermore, detector means may be those that work optically. In the aforementioned embodiments, furthermore, the wire bonder may be replaced by the pellet bonder, and the pellet bonder may be replaced by the wire bonder. Moreover, the embodiments may be combined.

The foregoing description has chiefly dealt with the case where the invention accomplished by the inventors was adapted to the bonding technique for the semiconductor devices of the lead frame type in the field of art that served as the background of the invention. The invention, however, is in no way limited thereto only, but can also be adapted to the apparatus for processing or manufacturing semiconductor devices that use ceramics or other package bases and works other than the semiconductor devices.

What is claimed is:

1. A manufacturing method for a semiconductor device which includes a semiconductor pellet, a plurality of metal leads, and a plurality of bonding wires connecting therebetween, comprising the steps of:
   detecting the type of lead frame being processed;
   generating an ouput signal indicative of the type of the lead frame detected;
   controlling at least one bonding condition in response to the output signal so as to obtain an appropriate bonding between the pellet and the lead portions of the lead frame being processed irrespective of the type of lead frame being processed; and
   performing wire bonding processes according to the controlled bonding condition.

2. A manufacturing method for enabling processing of a plurality of different types of lead frames to insure appropriate bonding of at least one electrical component to a lead frame being processed, comprising the steps of:

providing an ouput signal indicative of the type of lead frame being processed; and controlling at least one bonding condition of the at least one electrical component and the lead frame in dependence upon the type of lead frame being processed in accordance with the output signal indicative of the type of lead frame being processed;

whereby an appropriate bonding of the at least one electrical component to the lead frame being processed is obtained irrespective of the type of lead frame being processed.

3. A manufacturing method according to claim 2, wherein the output signal indicative of the type of lead frame being processed is provided by a detecting means of a lead frame indicating means, the detecting means detecting the type of lead frame being processed and providing the output signal indicative thereof.

4. A manufacturing method according to claim 3, wherein the at least one electrical component includes a semiconductor device pellet, and further comprising the step of securing the semiconductor device pellet on a predetermined bonding position of the lead frame being processed by a pellet bonding apparatus.

5. A manufacturing method according to claim 3, further comprising the steps of transferring the lead frame to a predetermined bonding position with a transfer means, the transfer means being variable in a lengthwise direction of the lead frame for varying the lengthwise transfer position thereof, and controlling the transfer means with a control means to vary the lengthwise transfer position of the lead frame in accordance with the detected type of lead frame being processed at the at least one bonding condition.

6. A manufacturing method according to claim 4, further comprising the steps of guiding the lead frame to a predetermined bonding position with a guide means, the guide means being variable in a widthwise direction of the lead frame to vary the widthwise guiding of the lead frame, and controlling the guide means with a control means to vary the widthwise guiding of the lead frame in accordance with the detected type of lead frame being processed as the at least one bonding condition.

7. A manufacturing method according to claim 4, further comprising the steps of heating the lead frame with a heat block means at the predetermined bonding position, and controlling the temperature of the heat block means with a control means in accordance with the detected type of lead frame being processed as the at least one bonding condition.

8. A manufacturing method according to claim 7, wherein the heat block means comprises a plurality of individual sections, and the control means controls the temperature of the individual sections of the heat block means so as to control a temperature distribution of the heat block means condition in accordance with the detected type of lead frame being processed as the at least one bonding condition.

9. A manufacturing method according to claim 3, wherein the at least one electrical component includes fine wires, and further comprising the steps of effecting a wire bonding process for connecting the fine wires between bonding pads on a semiconductor device pellet and leads of the lead frame being processed at a predetermined wire bonding position.

10. A manufacturing method according to claim 9, further comprising the steps of transferring the lead frame with a transfer means to the predetermined bonding position, the transfer means being variable in a lengthwise direction of the lead frame for varying the lengthwise transfer position thereof, and controlling the transfer means with a control means to vary the lengthwise transfer position of the lead frame in accordance with the detected type of lead frame being processed as the at least one bonding condition.

11. A manufacturing method according to claim 9, further comprising the steps of guiding the lead frame to the predetermined bonding position with a guide means, the guide means being variable in a widthwise direction of the lead frame to vary the widthwise guiding of the lead frame, and controlling the guide means with the control means to vary the widthwise guiding of the lead frame in accordance with the detected type of lead frame being processed as the at least one bonding condition.

12. A manufacturing method according to claim 9, further comprising the steps of heating the lead frame with a heat block means at the predetermined bonding position, and controlling the temperature of the heat block means with a control means in accordance with the detected type of lead frame being processed as the at least one bonding condition.

13. A manufacturing method according to claim 12, wherein the heat block means comprises a plurality of individual sections, and the control means controls the temperature of the individual sections of the heat block means so as to control a temperature distribution of the heat block means in accordance with the detected type of lead frame being processed as the at least one bonding condition.

14. A manufacturing method for a semiconductor device which includes a semiconductor pellet, a plurality of metal leads, and a plurality of bonding wires connecting therebetween, comprising the steps of:

detecting the type of lead frame being processed;

providing an output signal indicative of the type of the lead frame detected; and securing the semiconductor pellet on the lead frame by automatically setting a die-bonding condition in accordance with the output signal so as to obtain an appropriate bonding to the semiconductor pellet and the leads of the lead frame.

15. A manufacturing method according to claim 14, wherein the step of detecting the type of lead frame includes utilizing a TV camera.

16. A manufacturing method according to claim 14, wherein the automatic setting of the die-bonding condition includes automatically setting chute means for guiding a transferred lead frame to be processed in accordance with the output signal, and transferring the lead frame to be die-bonded.

17. A manufacturing method according to claim 14, wherein the automatic setting of the die-bonding condition includes automatically setting a transferring pitch for the lead frame in accordance with the output signal, and transferring the lead frame to a position to be die-bonded.

18. A manufacturing method according to claim 14, further comprising the step of controlling a temperature distribution of heat block means for heating the lead frame when the lead frame is being die-bonded.

19. A manufacturing method according to claim 15, wherein the automatic setting of a die-bonding condition includes automatically setting chute means for guiding a transferred lead frame to be processed in accordance with the output signal, and transferring the lead frame to be die-bonded.

20. A manufacturing method according to claim 15, wherein the automatic setting of the die-bonding condition includes automatically setting a transferring pitch for the lead frame in accordance with the output signal, and transferring the lead frame to a position to be die-bonded.

21. A manufacturing method according to claim 15, further comprising the step of controlling a temperature distribution of a heat block means for heating the lead frame when the lead frame is being die-bonded.

* * * * *